United States Patent
Hashizume et al.

(10) Patent No.: US 10,886,428 B2
(45) Date of Patent: Jan. 5, 2021

(54) METHOD OF MANUFACTURING SEMICONDUCTOR ELEMENT

(71) Applicant: NICHIA CORPORATION, Anan (JP)

(72) Inventors: Kenji Hashizume, Anan (JP); Eiji Muramoto, Tokushima (JP); Nobuyoshi Niki, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/576,261

(22) Filed: Sep. 19, 2019

(65) Prior Publication Data
US 2020/0098946 A1 Mar. 26, 2020

(30) Foreign Application Priority Data

Sep. 20, 2018 (JP) ................................. 2018-176121

(51) Int. Cl.
*H01L 33/62* (2010.01)
*H01L 33/00* (2010.01)

(52) U.S. Cl.
CPC ............ *H01L 33/007* (2013.01); *H01L 33/62* (2013.01)

(58) Field of Classification Search
CPC ....... H01L 2924/00014; H01L 2924/00; H01L 2224/48227; H01L 2924/15311; H05K 2201/09563; H05K 2201/096; H05K 3/4652
See application file for complete search history.

(56) References Cited

U.S. PATENT DOCUMENTS

| 8,598,614 B2 | 12/2013 | Chen et al. |
| 8,643,040 B2 | 2/2014 | Lee et al. |
| 10,134,956 B2 | 11/2018 | You et al. |
| 10,153,398 B2 | 12/2018 | Ko et al. |
| 2004/0014317 A1* | 1/2004 | Sakamoto ......... H01L 23/49838 438/689 |
| 2011/0169040 A1* | 7/2011 | Seo ...................... H01L 33/007 257/98 |
| 2011/0180820 A1* | 7/2011 | Seo ..................... H01L 25/0753 257/88 |
| 2012/0168809 A1 | 7/2012 | Maute et al. |

(Continued)

FOREIGN PATENT DOCUMENTS

| JP | 2013-084878 A | 5/2013 |
| JP | 2013-162025 A | 8/2013 |

(Continued)

*Primary Examiner* — Jaehwan Oh
(74) *Attorney, Agent, or Firm* — Foley & Lardner LLP

(57) ABSTRACT

A method of manufacturing a semiconductor element includes: a first providing step comprising providing a structure body comprising a semiconductor stacked body, the structure body including first surfaces that include surfaces defining at least one first recess; a first forming step comprising forming a first rough-surface portion at or inward of at least a portion of the surfaces defining the first recess of the structure body; a second forming step comprising forming a first metal layer at a first surface side of the structure body; a second providing step comprising providing a substrate on which a second metal layer is disposed; and a bonding step comprising heating the first metal layer and the second metal layer in a state in which the first metal layer and the second metal layer face each other.

9 Claims, 11 Drawing Sheets

(56) References Cited

U.S. PATENT DOCUMENTS

| 2013/0087814 | A1* | 4/2013 | Moon | H01L 25/13 |
| | | | | 257/88 |
| 2013/0221367 | A1 | 8/2013 | Furuki et al. | |
| 2014/0239341 | A1 | 8/2014 | Matsumura | |
| 2015/0263236 | A1 | 9/2015 | Suzuki | |
| 2016/0276540 | A1 | 9/2016 | Miyabe et al. | |

FOREIGN PATENT DOCUMENTS

| JP | 2014-195055 A | 10/2014 |
| JP | 2015-173177 A | 10/2015 |
| JP | 2016-174018 A | 9/2016 |
| WO | WO-2010/139567 A2 | 12/2010 |

\* cited by examiner

US 10,886,428 B2

METHOD OF MANUFACTURING SEMICONDUCTOR ELEMENT

CROSS-REFERENCE TO RELATED APPLICATIONS

This application is based upon and claims priority to Japanese Patent Application No. 2018-176121, filed on Sep. 20, 2018; the entire contents of which are incorporated herein by reference.

FIELD

The present disclosure relates to a method of manufacturing a semiconductor element.

BACKGROUND

Japanese Patent Publication No. 2016-174018 describes a method of manufacturing a semiconductor element including a step of bonding two members. In the step of bonding in Japanese Patent Publication No. 2016-174018, for example, a member having a surface with a recess is bonded to another member.

SUMMARY

A technique that allows for simplifying manufacturing steps and reducing manufacturing cost in a method of manufacturing a semiconductor element including such a bonding step would be desirable.

According to one embodiment of the present invention, a method of manufacturing a semiconductor element includes a first providing step including providing a structure body, the structure body including a semiconductor stacked body and including first surfaces that include surfaces defining at least one first recess; a first forming step including forming a first rough-surface portion at or inward of at least a portion of the surfaces defining the first recess of the structure body, the first rough-surface portion being rougher than another portion of the first surfaces; a second forming step including forming a first metal layer at a first surface side of the structure body; a second providing step including providing a substrate on which a second metal layer is disposed; and a bonding step including heating the first metal layer and the second metal layer in a state in which the first metal layer and the second metal layer face each other such that the first metal layer and the second metal layer are melted and bonded together and the melted first metal layer flows into the first recess.

The present disclosure allows for providing a method of manufacturing a semiconductor device in which steps can be simplified and manufacturing cost can be reduced.

DETAILED DESCRIPTION

Figure 1A:
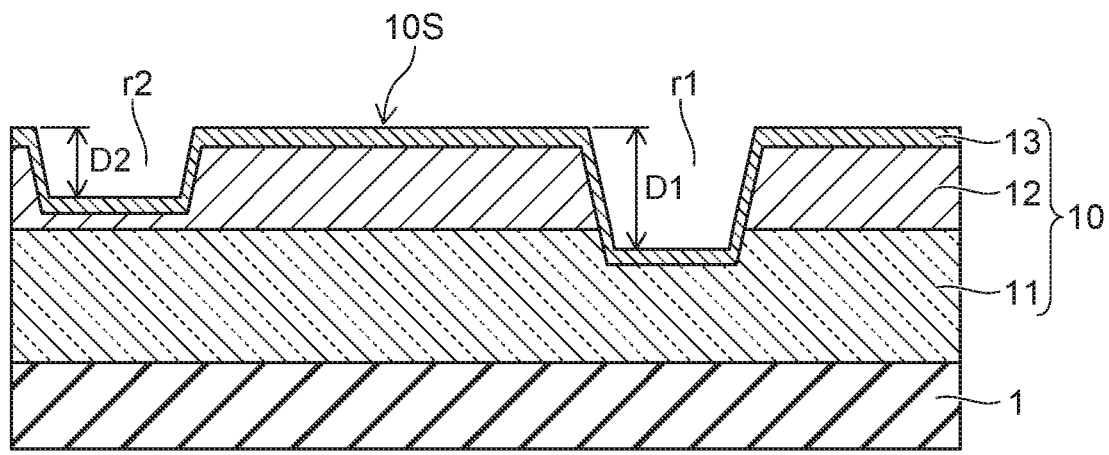
FIG. 1A to FIG. 1H are schematic cross-sectional views illustrating steps in a method of manufacturing a semiconductor element according to one embodiment of the present invention.

Certain embodiments will be described with reference to the drawings. The same components in the drawings are designated with the same reference numerals.

FIG. 1A to FIG. 1H are schematic cross-sectional views illustrating steps in a method of manufacturing a semiconductor element according to one embodiment of the invention.

A structure body 10 shown in FIG. 1A is provided (a first providing step). The structure body 10 is disposed on a substrate 1, and includes a semiconductor stacked body 11, a stacked body 12, and an electrode film 13. The structure body 10 includes surfaces 10S (i.e., first surfaces) that include surfaces defining a recess r1 (i.e., a first recess) and a recess r2 (i.e., a second recess). The recess r1 has a depth greater than a depth of the recess r2, extends through the stacked body 12, and reaches the semiconductor stacked body 11.

The semiconductor stacked body 11 is disposed on the substrate 1. The substrate 1 is, for example, a sapphire substrate. The semiconductor stacked body 11 includes a plurality of layers made of semiconductor materials such as silicon, gallium nitride, gallium arsenide, silicon nitride, etc. In the case of using a sapphire substrate for the substrate 1, it is preferable that the semiconductor stacked body 11 includes a semiconductor material made of a nitride semiconductor such as $In_XAl_YGa_{1-X-Y}$ ($0 \leq X$, $0 \leq Y$, and $X+Y<1$), etc. The semiconductor stacked body 11 may include semiconductor layers doped with impurities.

In a plan view, the stacked body 12 is disposed on a surface of the semiconductor stacked body 11 overlapping a region where the recess r1 is not provided. The stacked body 12 includes, for example, one or more insulating layers and one or more metal layers. In one example, the insulating layer in the stacked body 12 includes silicon nitride or silicon oxide. In one example, the metal layer in the stacked body 12 includes silver or aluminum.

The electrode film 13 is disposed along the surfaces 10S. In other words, the electrode film 13 is located not only on the upper surface of the stacked body 12 but also on lateral surfaces and a bottom surface of the recess r1 and lateral surfaces and a bottom surface of the recess r2. The electrode film 13 may be a single layer or may have a layered structure. A portion of the electrode film 13 on the bottom surface of the recess r1 is in contact with the semiconductor stacked body 11. The electrode film 13 is provided to increase the electrical contact area between the semiconductor stacked body 11 and another member bonded on the electrode film 13. In one example, the electrode film 13 includes aluminum or an alloy having aluminum as a main component.

Figure 1B:
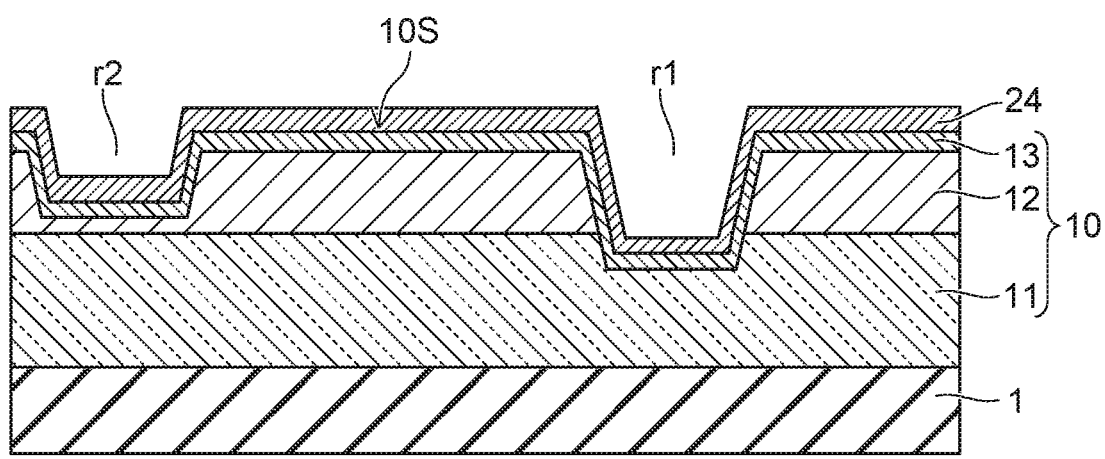

Next, as shown in FIG. 1B, in a third forming step, a metal layer 24 (i.e., a fourth metal layer) is formed along corresponding surfaces of the electrode film 13. The metal layer 24 functions as a seed layer when forming a metal layer 23a and a metal layer 23b described below using an electroplating technique. The metal layer 24 may be a single layer or may have a stacked structure. For example, the metal layer 24 is formed by stacking a titanium layer, a nickel layer, and a gold layer, in this order, on a surface of the electrode film 13.

Figure 1C:
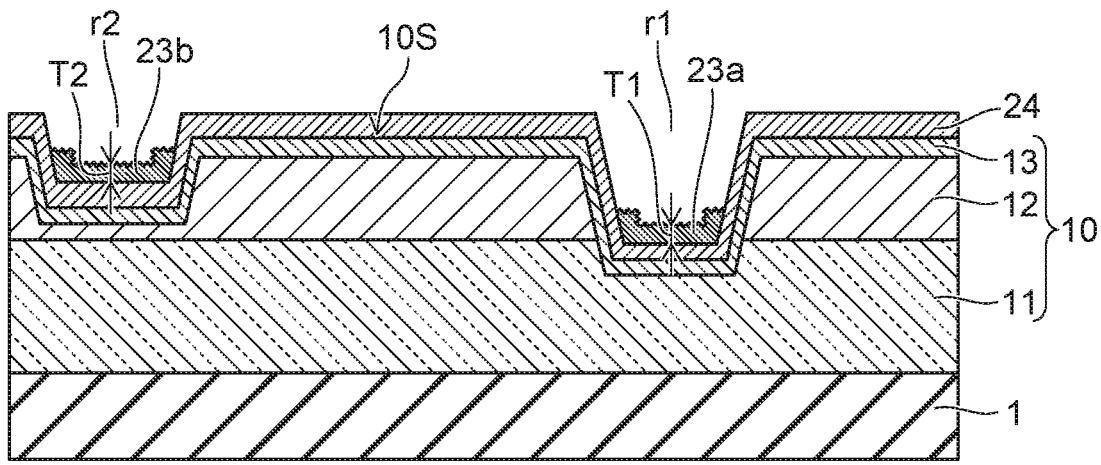

Then, a rough-surface portion is formed at or inward of at least a portion of surfaces of the structure body 10 that define the recess r1. The rough-surface portion in the recess r1 is referred to as a "first rough-surface portion". Also, another rough-surface portion is formed at or inward of at least a portion of surfaces defining the recess r2. The rough-surface portion in the recess r2 is referred to as a "second rough-surface portion". In the present embodiment, formation of the first rough-surface portion and second rough-surface portion are performed in a first forming step. For example, as shown in FIG. 1C, these rough-surface portions are formed by disposing a metal layer 23a (i.e., a third metal layer) and a metal layer 23b. Surfaces of the metal layer 23a opposite to the metal layer 24 and surfaces of the metal layer 23b opposite to the metal layer 24 are rough surfaces having an arithmetic average roughness Ra greater than the surfaces defining the recess r1 and the surfaces defining the recess r2 before forming the metal layer 23a and the metal layer 23b. With the metal layer 23a and the metal layer 23b, a roughness of at least a portion of the surfaces defining the recess r1 and a roughness of at least a portion of the surfaces defining the recess r2 are larger than a roughness of a surface of the metal layer 24.

For example, the metal layer 23a and the metal layer 23b are formed using an electroplating technique. When forming the metal layer 23a and the metal layer 23b, a mask is formed on surfaces of the surfaces 10S other than surfaces defining the recess r1 and the recess r2. A photoresist for a photolithography technique is used to form such a mask. Subsequently, electroplating is performed on the surfaces 10S via the mask. Then, the mask is removed by etching, etc. Accordingly, the metal layer 23a and the metal layer 23b are formed on only at least a portion of the surfaces defining the recess r1 and at least a portion of the surfaces defining the recess r2, respectively. Thus, in this embodiment, the rough-surface portions are formed inward of at least a portion of the surfaces defining the first recess of the structure body. Any appropriate materials can be used for the metal layer 23a and the metal layer 23b. For example, the metal layer 23a and the metal layer 23b may be made of nickel.

A method other than plating may be used to form the metal layer 23a and the metal layer 23b as long as these metal layers can be formed with roughened surface using the method. The formation of the metal layer 24 may be omitted when a technique other than a plating technique is used for forming of the metal layer 23a and the metal layer 23b.

Figure 1D:
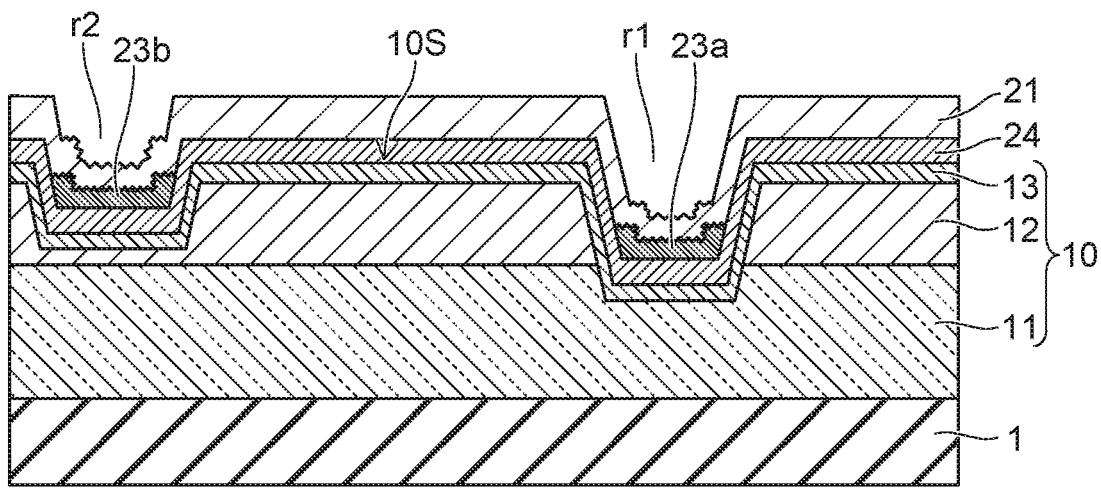

Then, as shown in FIG. 1D, in a second forming step, a metal layer 21 (i.e., a first metal layer) is formed on the structure body 10 on which the metal layer 23a and the metal layer 23b are provided. For example, when forming the metal layer 21, the metal layer 21 is disposed along the surfaces 10S, in the recess r1 and the recess r2.

The metal layer 21 is disposed to bond the structure body 10 to another member. Examples of a material of the metal layer 21 include any metal appropriate for bonding. For example, the metal layer 21 may be made of tin.

Figure 1E:
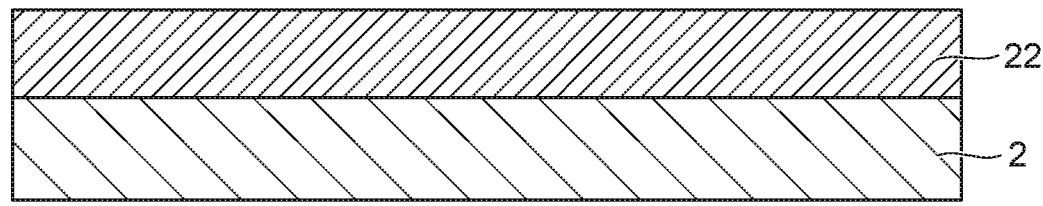

On the other hand, separately from the structure body 10 as shown in FIG. 1E, a substrate 2 on which a metal layer 22 (a second metal layer) is disposed is provided in a second providing step. For example, the substrate 2 made of Si, CuW, or the like. The metal layer 22 is provided to be bonded to the metal layer 21 of the structure body 10. The metal layer 22 may be a single layer or may have a stacked structure. For example, the metal layer 22 is formed by stacking a platinum layer, a titanium layer, a nickel layer, and a tin layer, in this order.

Figure 1F:
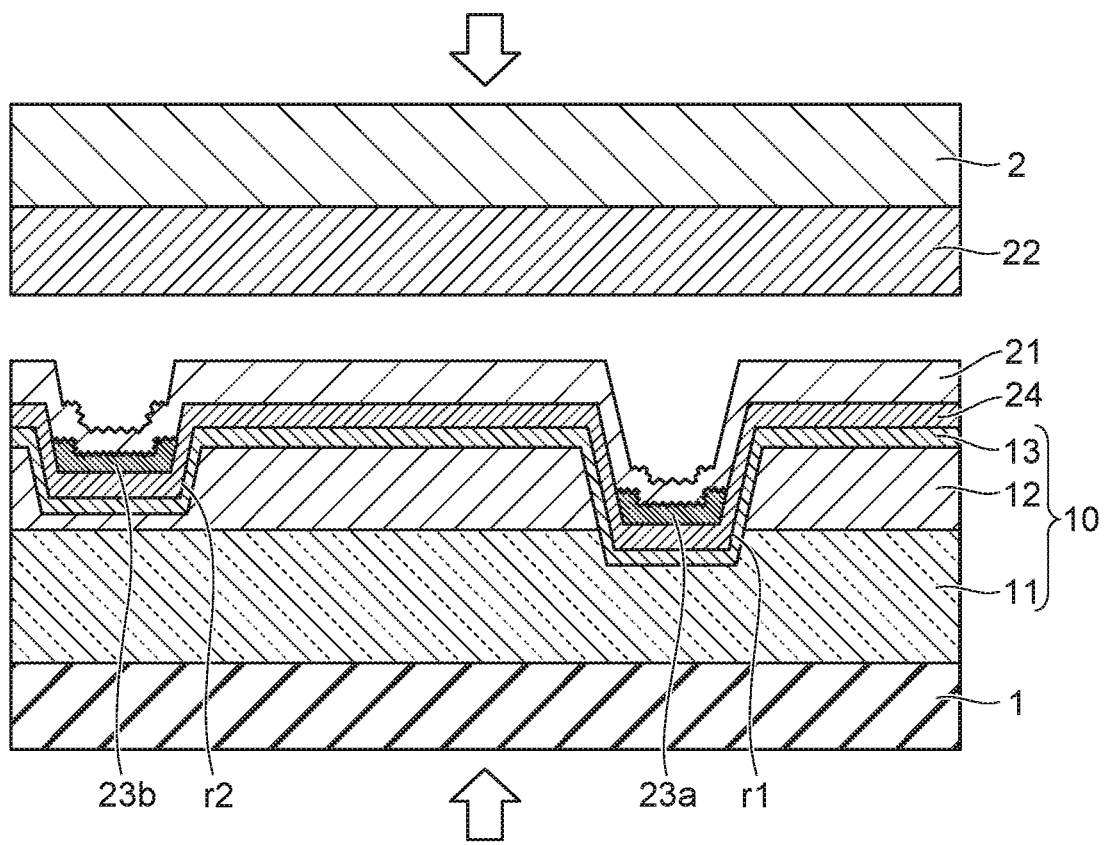
Figure 1G:
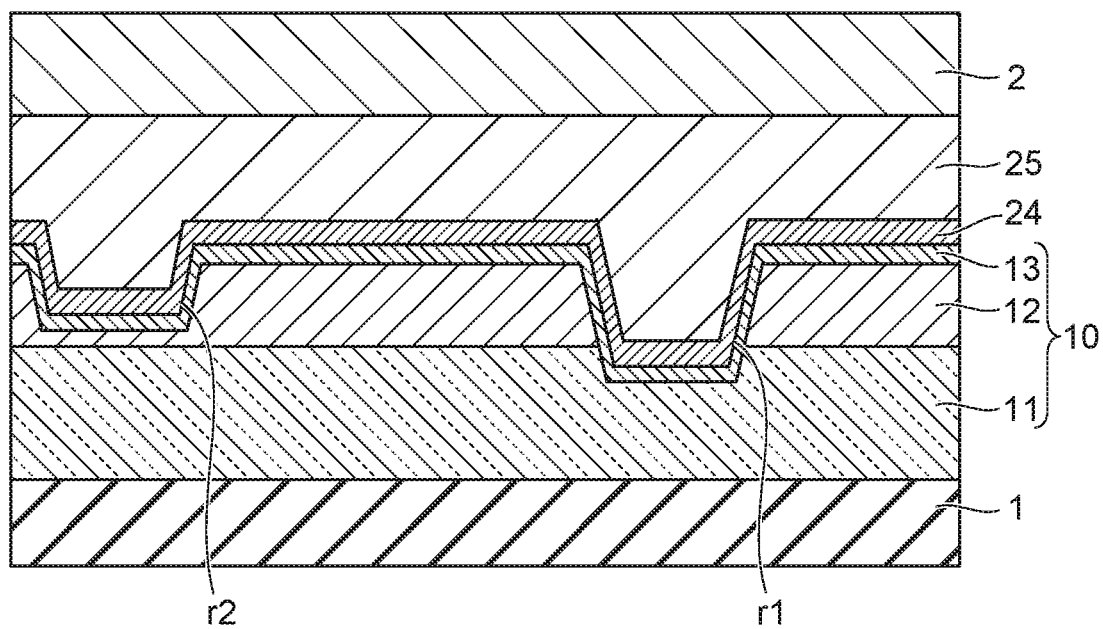

Then, in a bonding step as shown in FIG. 1F, the metal layer 21 and the metal layer 22 are caused to face each other, and the metal layer 21 and the metal layer 22 are bonded together. In the bonding step, heating is performed while pressing the substrate 1 and the substrate 2 toward each other. Accordingly, the metal layer 21 and the metal layer 22 are melted and are bonded together. Also, at this time, with the rough-surface portions inside the recess r1 and in the recess r2, the melted metal layer 21 and the melted metal layer 22 flow into the recess r1 and into the recess r2. Thus, the recess r1 and the recess r2 are filled with the metal layer 21, the metal layer 22, respectively, and the like.

Figure 1H:
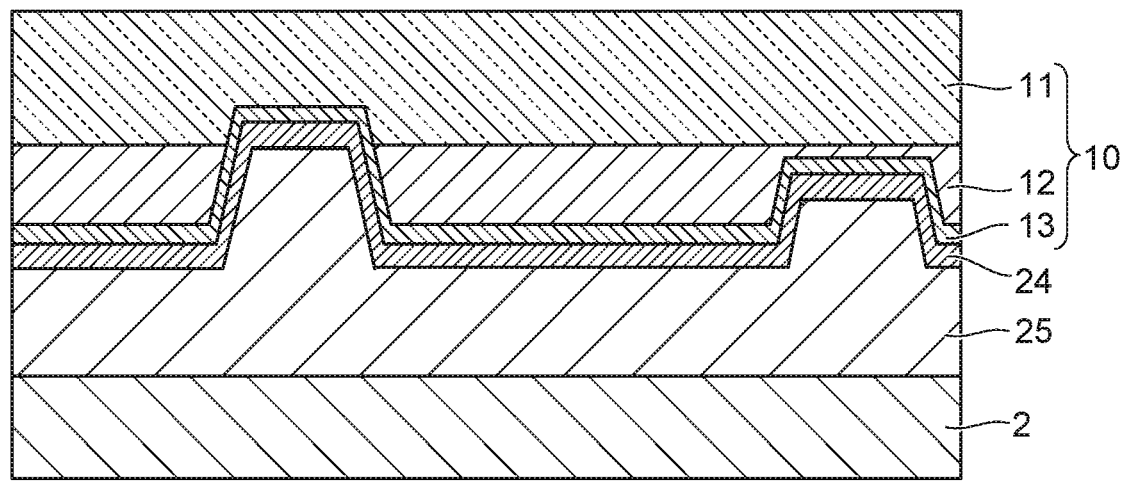

By the bonding described above, for example, as shown in FIG. 1G, corresponding ones of the metal layers 21, 22, 23a, 23b, and 24 are mixed and alloyed, so that an alloy layer 25 is formed. After bonding, for example, as shown in FIG. 1H, the substrate 1 at the structure body 10 side may be removed.

Effects obtained according to the first embodiment will be described with reference to comparative examples. Two methods described below are examples of methods of manufacturing according to the comparative examples.

In a method according to Comparative Example 1, the metal layer 21 is formed on the surfaces 10S of the structure body 10 defining the recess r1 without forming the metal layer 23a and the metal layer 23b. Subsequently, the metal layer 21 and the metal layer 22 formed on the substrate 2 are bonded together.

According to this method, the steps necessary for the bonding can be simplified. However, in this method, when a depth of the recess r1 is increased, the melted metal layer 21 and the melted metal layer 22 do not flow sufficiently into the recess r1 in the bonding step. Accordingly, in the semiconductor element after bonding, a hollow (a void) is formed at the position where the recess r1 is provided. Presence of the hollow may cause reduction in the bonding strength, the electrical characteristics, and the heat dissipation of the semiconductor element.

In a method according to Comparative Example 2, a metal film with a high thickness for filling the recess is formed on the entirety of the surfaces 10S of the structure body 10 without forming the metal layer 23a and the metal layer 23b. Then, a surface of the metal film is planarized by etching. Next, the metal layer 21 is formed on the planarized surface of the metal film. Subsequently, the metal layer 21 and the metal layer 22 formed on the substrate 2 are bonded.

In the method according to Comparative Example 2, the recess of the surfaces 10S is filled securely with the metal film, which allows for improving the bonding strength, the electrical characteristics, and the heat dissipation of the manufactured semiconductor element. On the other hand, the number of steps are increased in the method according to Comparative Example 2, which may increase the manufacturing cost. In particular, when the recess r1 has a high thickness, a metal film with a relatively high thickness needs to be formed to fill the recess r1. Therefore, a long period of time may be necessary to form and planarize the metal film, and the manufacturing cost may be further increased.

Compared to these methods, in the method of manufacturing according to the first embodiment, the metal layer 23a that includes a rough-surface portion is formed at or inward of at least a portion of the surfaces defining the recess r1 instead of forming a metal film with a high thickness. The inventors have found that the rough-surface portion can facilitate flowing of the metal melted in the bonding step into the recess r1. With the rough-surface portion that can facilitate flowing of the melted metal into the recess r1, generation of a hollow at the portion where the recess r1 is provided in the semiconductor element after bonding can be prevented.

In other words, according to the method of manufacturing the semiconductor element according to the first embodiment, it is possible to fill the recess r1 with the metal layer 21 and the metal layer 22 even without forming a metal film with a high thickness to fill the recess r1. Therefore, even when the metal film is not formed, the degradation of the electrical characteristics and decrease of heat dissipation can be reduced while ensuring the bonding strength of the manufactured semiconductor element. Also, formation of the metal film with a high thickness and planarization of the metal film are not required, which allows for simplifying the manufacturing steps, so that the manufacturing cost of the semiconductor element can be reduced.

As described above, according to the method of manufacturing the semiconductor element according to the first embodiment, it is possible to simplify the steps and reduce the manufacturing cost while reducing reduction of bonding strength, degradation of electrical characteristics, and reduction of heat dissipation.

According to the method of manufacturing according to the first embodiment, a rough-surface portion (in the metal layer 23b) is formed also at or inward of at least a portion of the surfaces defining the recess r2 even though the recess r2 is has a thickness smaller than a thickness of the recess r1. With this structure, in the semiconductor element after bonding, generation of a hollow at the position where the recess r2 is defined can be prevented, which allows for improving bonding strength, electrical characteristics, and heat dissipation.

Verifications by the inventors confirmed that the metal layer 23a and the metal layer 23b each having surfaces with Ra of approximately 29.6 nm, and other surfaces with Ra of approximately 4.1 nm allows the melted metal layer 21 and the melted metal layer 22 to flow sufficiently into the recess r1 and the recess r2.

In the bonding step, it is desirable to heat the metal layer 21 and the metal layer 22 while pressing one of the structure body 10 (more specifically, the substrate 1) and the substrate 2 toward the other of the structure body 10 (more specifically, the substrate 1) and the substrate 2. Pressing facilitates flowing of the melted metal layer 21 and the melted metal layer 22 into the recess r1 and the recess r2. Also, according to the first embodiment, the melted metals easily flow into the recess r1 and the recess r2, so that the load applied to the substrate 1 and the substrate 2 in bonding can be reduced. Therefore, damage of the substrate 1, the substrate 2, the structure body 10, etc., in bonding can be suppressed, so that yield of the semiconductor element can be increased.

Any appropriate method can be used for forming the metal layer 23a and the metal layer 23b as long as the surfaces of these metal layers can be roughened using the method. However, a plating technique is preferable for forming these metal layers. Using a plating technique allows for reducing a time for forming the metal layer 23a and the metal layer 23b that have rougher surfaces.

A thickness T1 of the metal layer 23a and a thickness T2 of the metal layer 23b are desired to be relatively small. Reduction of the thickness T1 and the thickness T2 allows for reducing a time necessary to form the metal layer 23a and the metal layer 23b. According to the first embodiment, even if the thickness T1 and the thickness T2 are reduced, the rough-surface portions allows the melted metal layer 21 and the melted metal layer 22 to be sufficiently flowed into the recess r1 and into the recess r2. The thickness T1 of the metal layer 23a and the thickness T2 of the metal layer 23b are smaller than a depth D1 of the recess r1. It is preferable that the thickness T1 and the thickness T2 are smaller than a depth D2 and are 0.1 times to 0.5 times the depth D1, and are more preferably 0.15 times to 0.3 times the depth D1. With the thickness T1 and the thickness T2 that are 0.1 times the depth D1 or greater, the effect of rough-surface portions can be obtained effectively, so that the melted metal layer 21 and the melted metal layer 22 can be easily flowed into the recess r1 and r2. With the thickness T1 and the thickness T2 that are 0.5 times the depth D1 or smaller, the time for forming the metal layer 23a can be reduced, so that the yield can be increased. The depth D1 of the recess r1 can be, for example, approximately in a range of 4 μm to 7 μm. The depth D2 of the recess r2 can be, for example, approximately in a range of 1 μm to 3 μm. The thickness T1 and the thickness T2 can be, for example, approximately in a range of 1 μm to 3 μm.

Any appropriate materials may be used for the metal layers described above, it is desirable that the metal layer 21 contains tin and the metal layer 22, the metal layer 23a, and the metal layer 23b contain nickel. The metal layer 21 containing tin can have a lower melting point. Reduction in the melting point of the metal layer 21 allows reduction in the temperature when bonding the substrate 1 and the substrate 2 and reduction of damage to the structure body 10 due to heat. Further, when the metal layer 22 contains nickel, an alloy of nickel of the metal layer 22 and tin of the melted metal layer 21 is formed. The melting point of an alloy of tin and nickel is higher than the melting point of simple tin. Accordingly, the heat resistance of the semiconductor element can be improved, and melting of the alloy layer in the steps after bonding can be prevented, so that the degree of freedom and the yield of the manufacturing steps of the semiconductor element can be increased.

In the bonding step, the alloy of tin and nickel described above may also be formed in the recess r1 and in the recess r2. The metal layers 23a and 23b in the recesses r1 and r2 allow a greater amount of tin to easily flow into the recesses r1 and r2, respectively. When a greater amount of tin is flowed into each of the recesses r1 and r2, a region far from the second metal layer 22 and the fourth metal layer 24, which contain nickel, is more easily generated in each of the recesses r1 and r2 than in other alloyed portions. Nickel in the second metal layer 22 or the fourth metal layer 24 is not easily supplied to the region far from the second metal layer 22 and the fourth metal layer 24. However, with the metal layer 23a and the metal layer 23b containing nickel in the recess r1 and the recess r2, insufficiency of nickel can be compensated when forming the alloy in the recess r1 and the recess r2. Accordingly, the melting point of the alloy of tin and nickel in the recess r1 and the recess r2 can be more surely increased, so that the yield of the semiconductor element can be increased.

Modified Example

FIG. 2A, FIG. 2B, FIG. 3A, and FIG. 3B are schematic cross-sectional views of steps, showing modified examples of the method of manufacturing the semiconductor element according to the first embodiment of the present invention.

The metal layer 23a and the metal layer 23b having rough surfaces are disposed to form rough-surface portions at or inward of at least a portion of the surfaces defining the recess r1 and the recess r2 in the example shown in FIG. 1A to FIG. 1H. Other methods may be employed for forming the rough-surface portions.

Figure 2A:
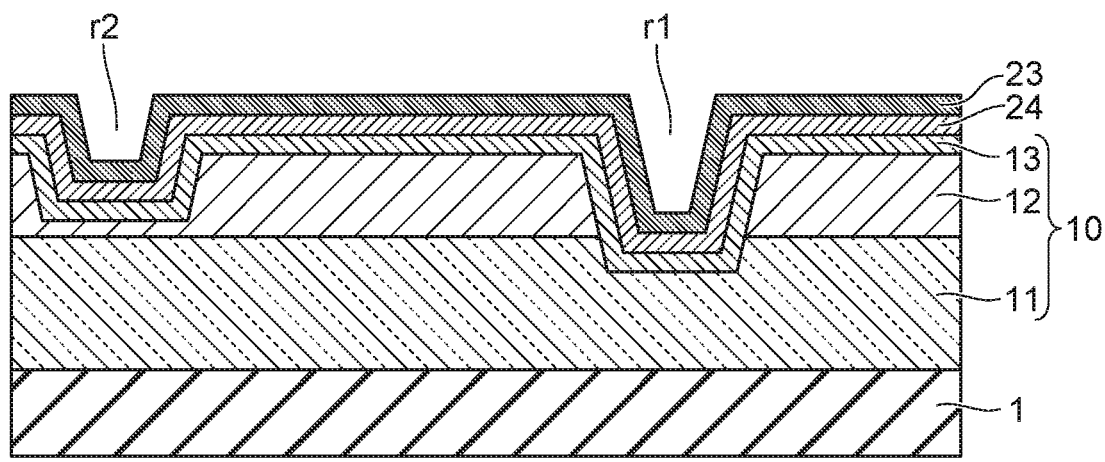
FIG. 2A, FIG. 2B, FIG. 3A, and FIG. 3B are schematic cross-sectional views illustrating modified examples of the method of manufacturing the semiconductor element according to one embodiment of the present invention.
Figure 2B:
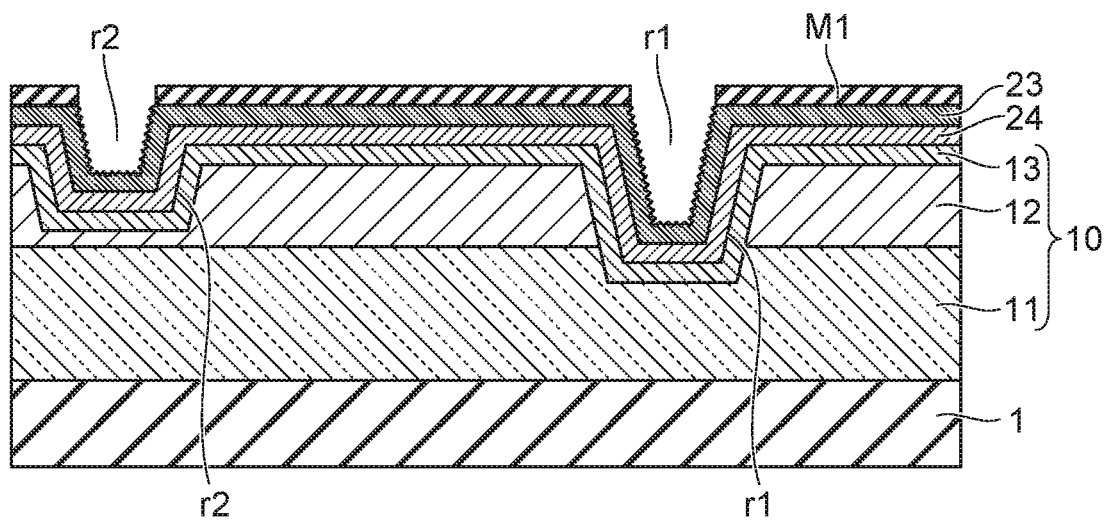

For example, in a modified example 1, after the metal layer 24 is formed, a metal layer 23 is formed on an entirety of corresponding surfaces of the metal layer 24 as shown in FIG. 2A. Next, a surface of the metal layer 23 other than where the recess r1 and the recess r2 are defined is covered with a mask M1. Subsequently, as shown in FIG. 2B, at least a portion of surfaces of the metal layer 24 in the recess r1 and the recess r2 not covered with the mask M1 is processed, which roughens corresponding surfaces of the metal layer 24. Examples of more specific methods for processing corresponding surfaces of the metal layer 24 include exposing the surfaces not covered with the mask M1 to plasma of an active gas or an inert gas, irradiating the surfaces not covered with the mask M1 with an ion beam of an inert gas, and wet etching the surfaces not covered with the mask M1 using an etchant.

Figure 3A:
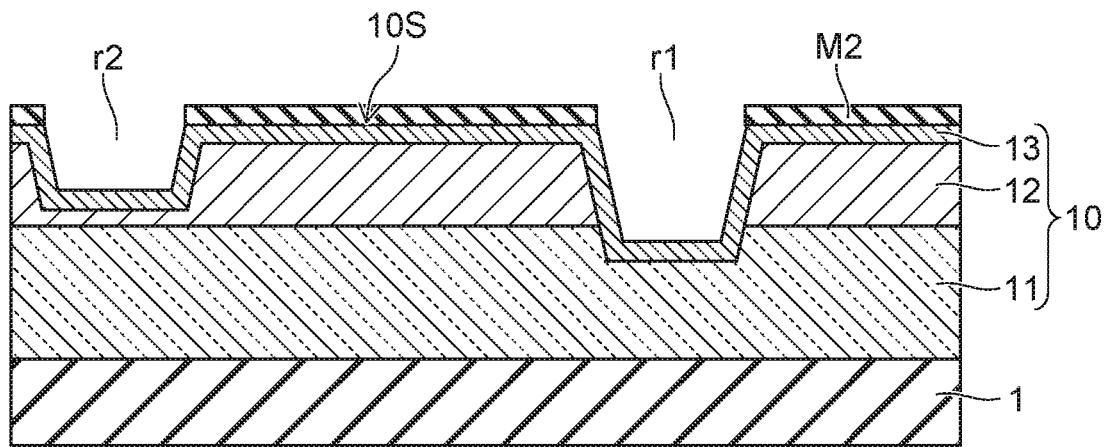
Figure 3B:
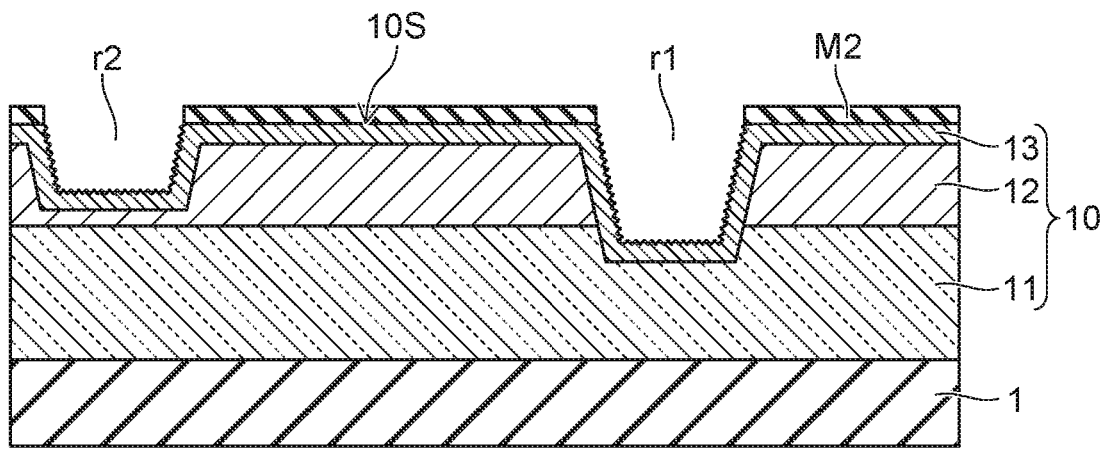

Alternatively, in a modified example 2, of the surfaces 10S of the structure body 10, surfaces other than surfaces defining the recess r1 and the recess r2 are covered with a mask M2 without forming the metal layer 24, as shown in FIG. 3A. Subsequently, as shown in FIG. 3B, of the surfaces 10S of the structure body 10, at least a portion of the surfaces defining the recess r1 and at least a portion of the surfaces defining the recess r2, which are not covered with the mask M2, are processed, which roughens corresponding surfaces. A method similar to the method described above is used to process the surfaces 10S of the structure body 10.

Using these methods also allows for forming rough-surface portions at at least a portion of the surfaces defining the recess r1 and inside the recess r2, as in the example shown in FIG. 1A to FIG. 1H. In other words, using these methods also allows the melted metal layer 21 and the melted metal layer 22 to be easily flowed into the recess r1 and into the recess r2 in the bonding step.

Application Example

The method of manufacturing the semiconductor element according to the first embodiment is widely applicable to bonding of two members in which a recess is defined in a surface of one of the members. In the description below, as an example, a case in which the method of manufacturing according to the first embodiment is applied to a method of manufacturing a semiconductor light-emitting element will be described.

The structure of the semiconductor light-emitting element to be manufactured is described with reference to FIG. 4 and FIG. 5.

Figure 4:
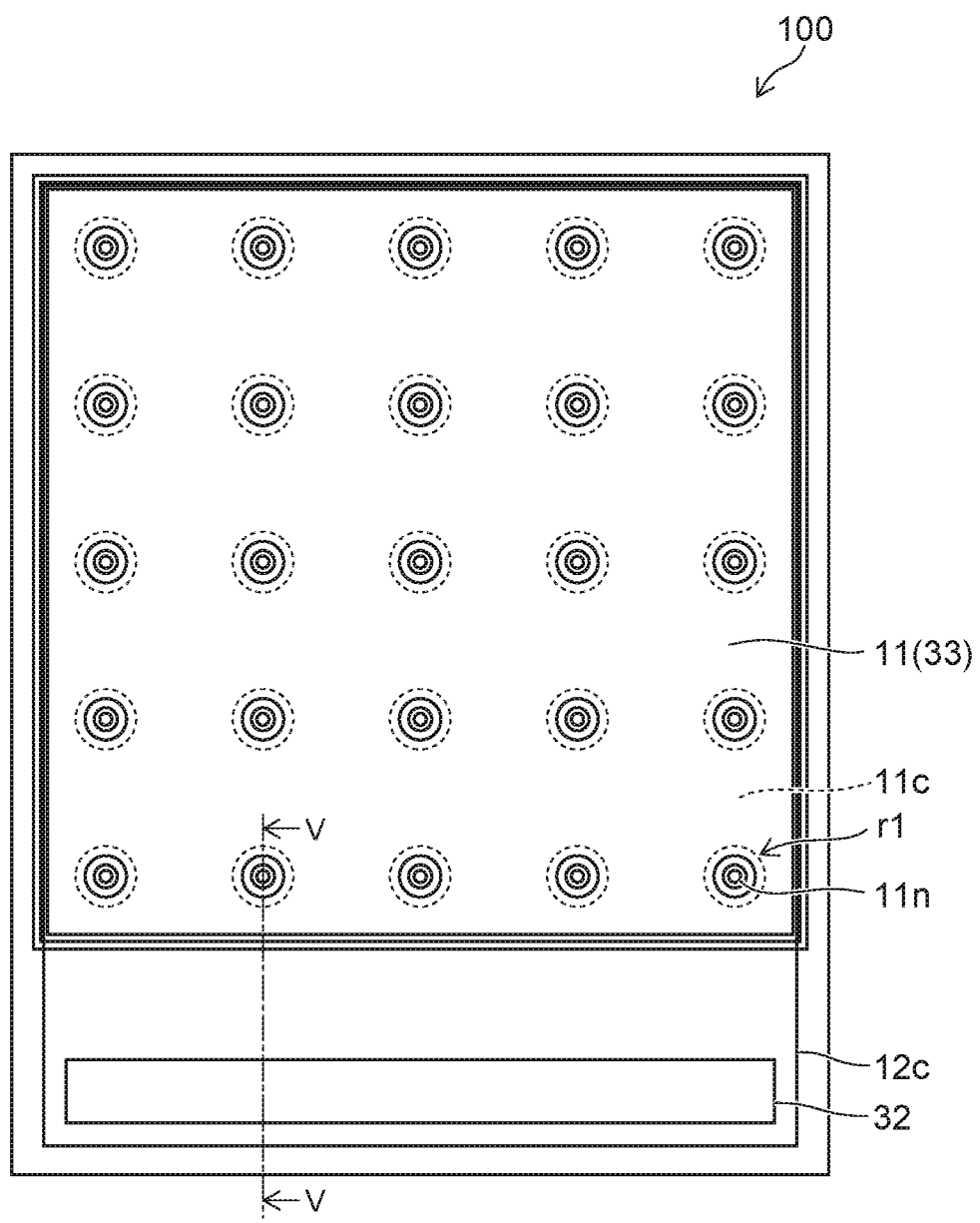
FIG. 4 is a schematic plan view showing a semiconductor light-emitting element manufactured using the method of manufacturing the semiconductor element according to one embodiment of the present invention.

FIG. 4 is a schematic plan view showing the semiconductor light-emitting element manufactured using the method of manufacturing the semiconductor element according to one embodiment of the invention.

Figure 5:
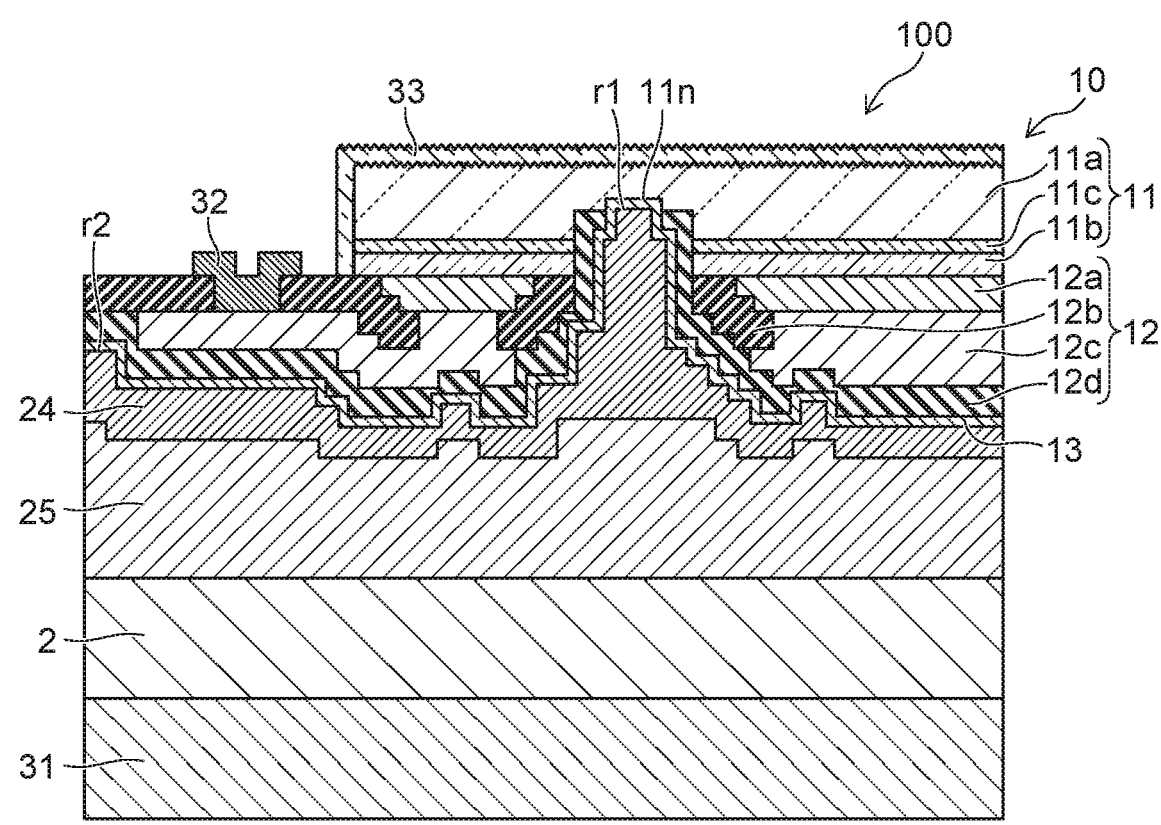
FIG. 5 is a cross-sectional view taken along V-V line of FIG. 4.

FIG. 5 is a cross-sectional view taken along a line V-V of FIG. 4.

As shown in FIG. 4 and FIG. 5, a semiconductor light-emitting element 100 includes a substrate 2, a structure body 10, a metal layer 24, an alloy layer 25, a back surface electrode 31, a p-pad electrode 32, and a protective layer 33.

The back surface electrode 31 is disposed at a back surface of the semiconductor light-emitting element 100. The substrate 2 is disposed on the back surface electrode 31. The alloy layer 25 is disposed on the substrate 2. A portion of the alloy layer 25 protrudes upward at positions above which the recess r1 and the recess r2 of the structure body 10 are defined. The metal layer 24 and the electrode film 13 are disposed along corresponding surfaces of the alloy layer 25.

The stacked body 12 is disposed on the electrode film 13 around the recess r1. The semiconductor stacked body 11 and the p-pad electrode 32 are disposed on the stacked body 12. The p-pad electrode 32 is spaced apart from the semiconductor stacked body 11 in a plan view.

The semiconductor stacked body 11 includes an n-type semiconductor layer 11a, a p-type semiconductor layer 11b, and a light-emitting layer 11c. The stacked body 12 includes a p-side electrode 12a, an insulating layer 12b, an interconnect layer 12c, and an insulating layer 12d.

The light-emitting layer 11c is disposed between the n-type semiconductor layer 11a and the p-type semiconductor layer 11b.

The n-type semiconductor layer 11a is disposed at an upper surface side of the semiconductor light-emitting element 100 in the semiconductor stacked body 11. In a plan view, the p-type semiconductor layer 11b and the light-emitting layer 11c are disposed at a portion of the lower surface of the n-type semiconductor layer 11a overlapping a region where the recess r1 is not defined.

The p-side electrode 12a is disposed under portions of the p-type semiconductor layer 11b around the recess r1. The insulating layer 12b covers the outer perimeter of the p-side electrode 12a and the lower surface of the p-type semiconductor layer 11b so that the interconnect layer 12c is prevented from being in contact with components other than the p-side electrode 12a. The interconnect layer 12c is disposed under the p-side electrode 12a and the insulating layer 12b and electrically connects the p-side electrode 12a and the p-pad electrode 32. The insulating layer 12d insulates the electrode film 13 from the interconnect layer 12c, the p-type semiconductor layer 11b, and the light-emitting layer 11c. The electrode film 13 is in contact with the n-type semiconductor layer 11a at the recess r1, and forms a contact surface 11n.

The protective layer 33 covers corresponding surfaces of the semiconductor stacked body 11. The upper surface of the n-type semiconductor layer 11a may be a roughened surface that is configured to scatter light to improve the light extraction efficiency of the semiconductor light-emitting element 100.

Examples of materials of the components will now be described.

The semiconductor stacked body 11 contains gallium nitride. The p-side electrode 12a and the interconnect layer 12c contain a metal material such as aluminum, silver, indium, titanium, nickel, etc. The insulating layer 12b and the insulating layer 12d contain an insulating material such as silicon oxide, etc.

The back surface electrode 31 at the back surface of the substrate 2 contains a metal such as platinum, etc. The p-pad electrode 32 contains a metal such as titanium, platinum, gold, etc. The protective layer 33 contains a transparent insulating material such as silicon oxide, etc.

FIG. 6A to FIG. 6F are schematic cross-sectional views of steps, showing an application example of the method of manufacturing the semiconductor element according to one embodiment of the invention.

Figure 6A:
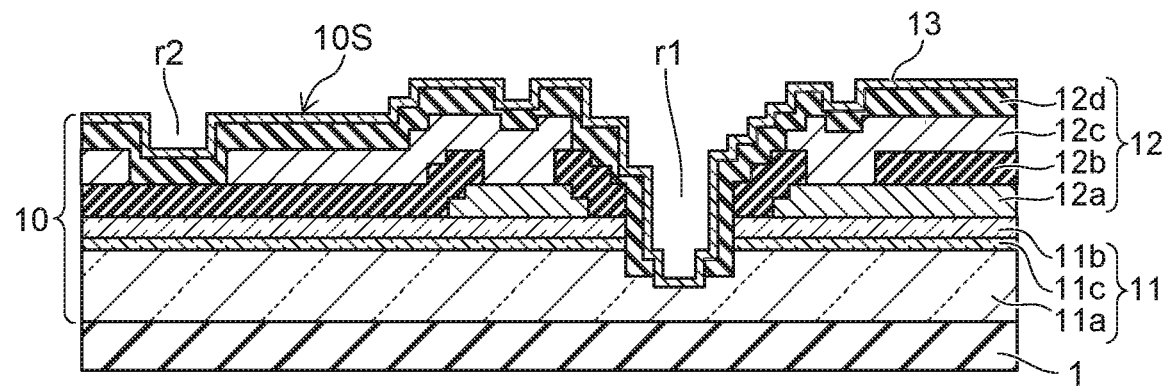
FIG. 6A to FIG. 6F are schematic cross-sectional views of steps, showing an application example of the method of manufacturing the semiconductor element according to one embodiment of the present invention.

The structure body 10 is provided as shown in FIG. 6A. The structure body 10 includes the semiconductor stacked body 11 and the stacked body 12 described above. The surfaces 10S of the structure body 10 include surfaces defining the recess r1 and the recess r2 having a depth smaller than a depth of the recess r1.

Figure 6B:
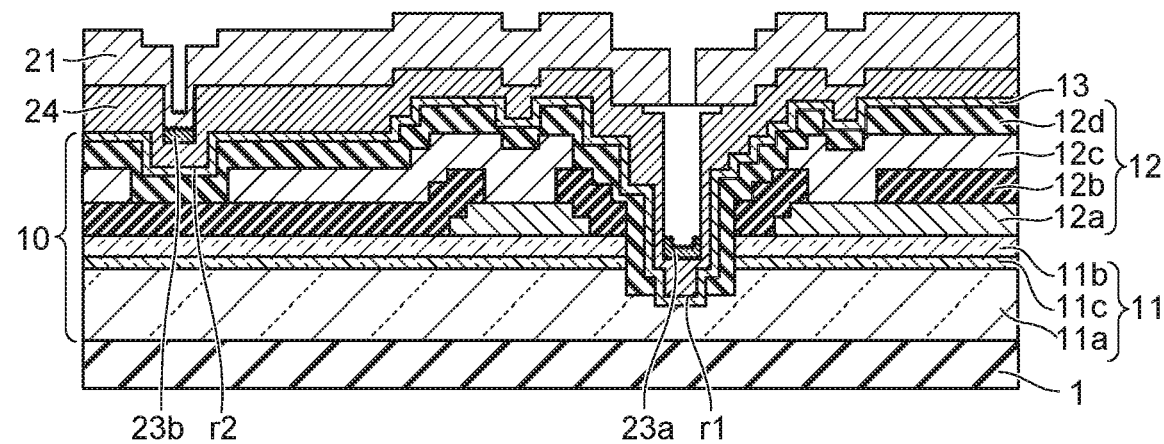
Figure 6C:
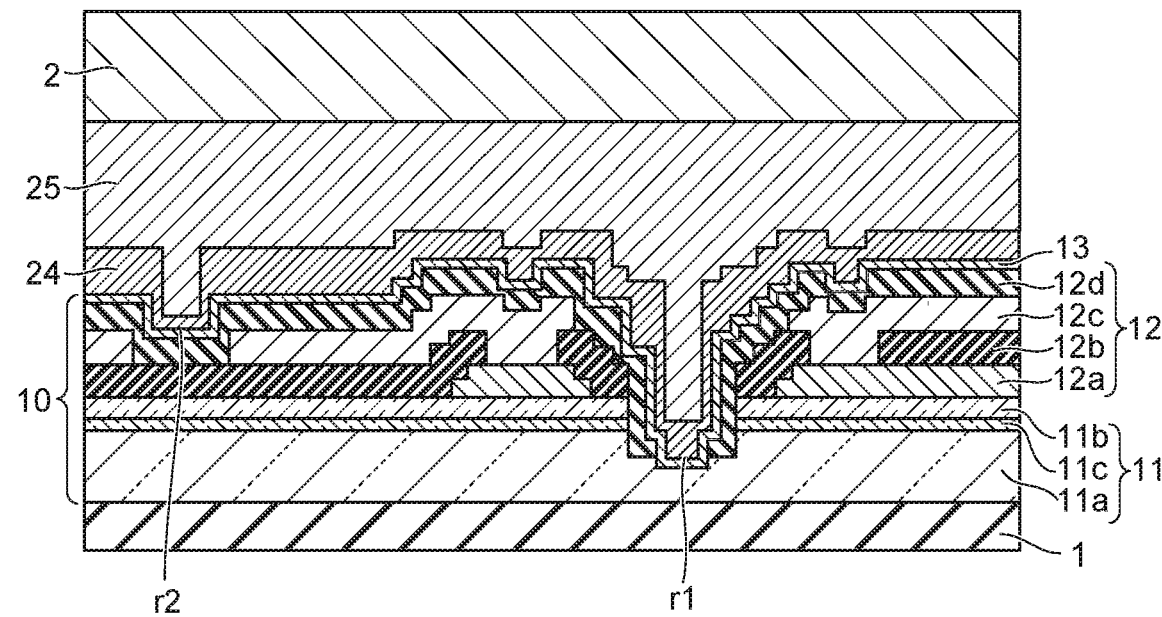

Next, the metal layer 23a and the metal layer 23b are formed above at least a portion of the surfaces defining the recess r1 and at least a portion of the surfaces defining the recess r2 of the structure body 10, respectively. Then, as shown in FIG. 6B, the metal layer 21 is formed at the surfaces 10S side of the structure body 10. The metal layer 21 is bonded to the metal layer 22 on the substrate 2 shown in FIG. 1E, so that the structure shown in FIG. 6C is obtained. In other words, the metal layer 21 and the metal layer 22 are bonded, and the metal layers 21, 22, 23a, 23b, and 24 are mixed to be alloyed, so that the alloy layer 25 is formed.

Figure 6D:
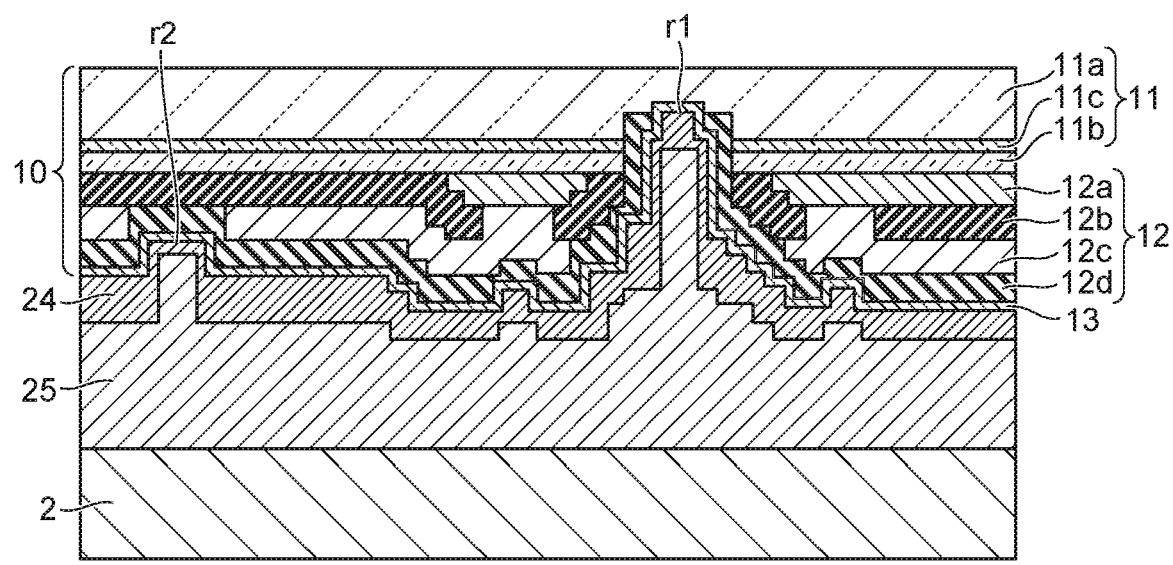
Figure 6E:
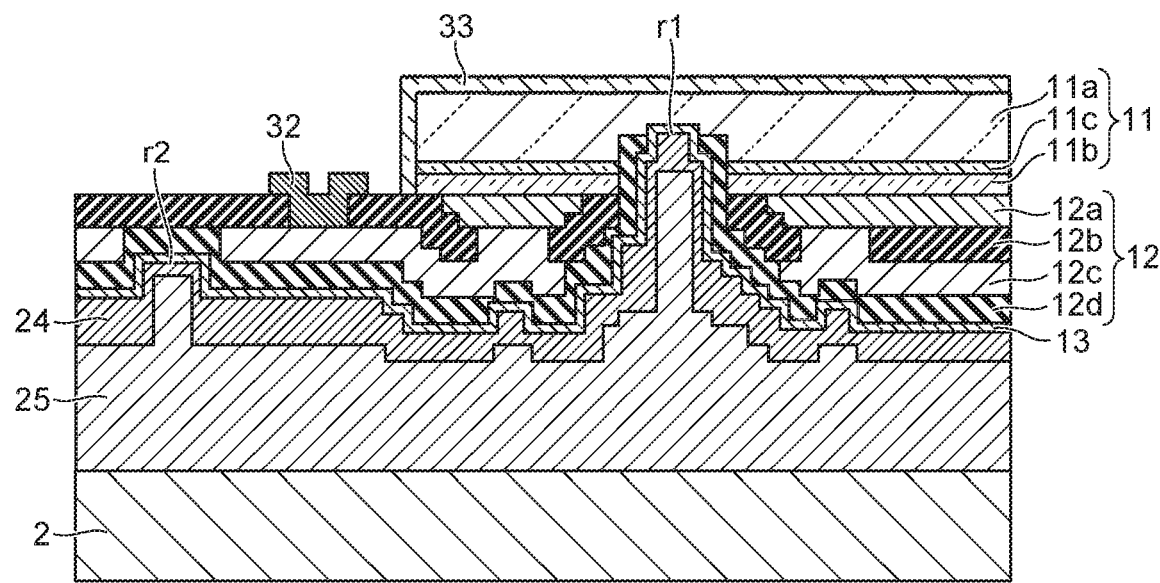
Figure 6F:
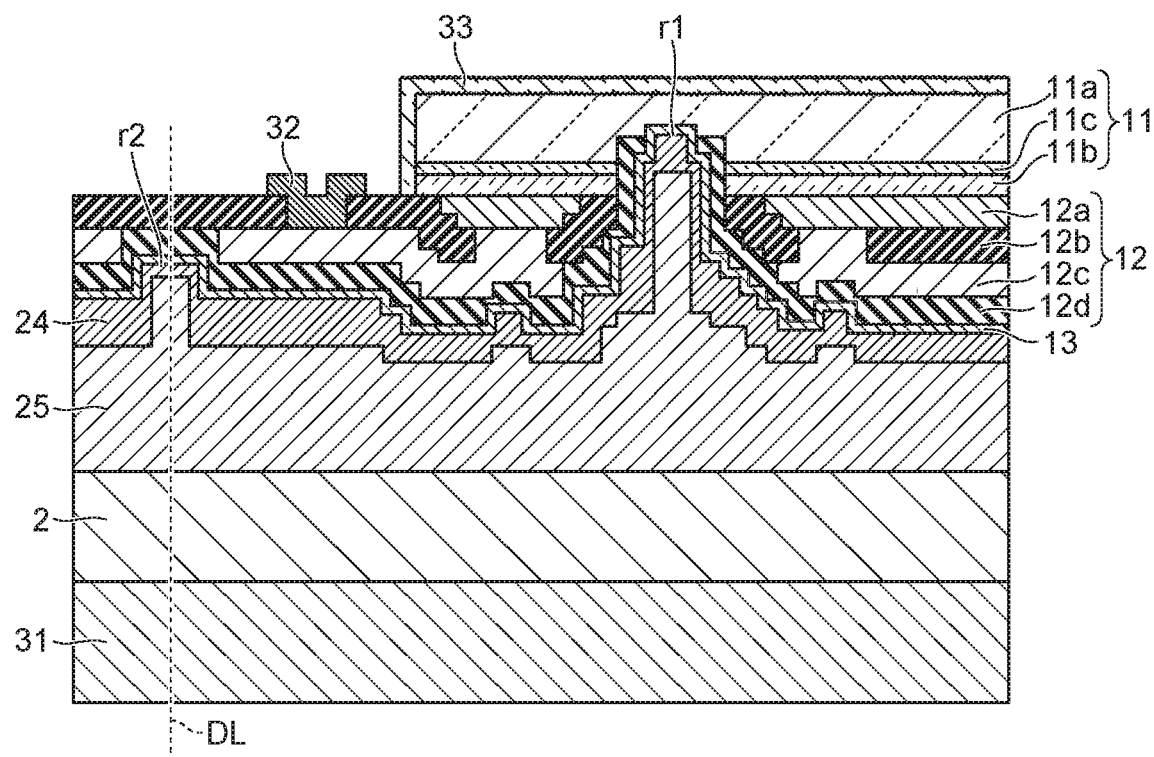

Then, the substrate 1 is removed as shown in FIG. 6D. Next, as shown in FIG. 6E, the semiconductor stacked body 11 and the insulating layer 12b are processed, so that the p-pad electrode 32 and the protective layer 33 are formed. Subsequently, as shown in FIG. 6F, the back surface electrode 31 is formed at the backside of the substrate 2. Then, the substrate 2 is diced at a dicing line DL shown in FIG. 6F. The dicing line DL is positioned in the region where the recess r2 is defined. The semiconductor light-emitting element 100 shown in FIG. 4 and FIG. 5 is manufactured through the steps described above.

The embodiments described above are examples for giving a concrete form of the invention, and the scope of the present invention is not limited to the embodiments described above. Any appropriate modifications of the embodiments described above made by one skilled in the art without departing from the spirit of the present invention also are within the scope of the invention.

What is claimed is:

1. A method of manufacturing a semiconductor element, the method comprising:
   a first providing step comprising providing a structure body comprising a semiconductor stacked body, the structure body including first surfaces that include surfaces defining at least one first recess;
   a first forming step comprising forming a first rough-surface portion at or inward of at least a portion of the surfaces defining the first recess of the structure body, the first rough-surface portion being rougher than another portion of the first surfaces;
   a second forming step comprising forming a first metal layer at a first surface side of the structure body;
   a second providing step comprising providing a substrate on which a second metal layer is disposed; and
   a bonding step comprising heating the first metal layer and the second metal layer in a state in which the first metal layer and the second metal layer face each other such that the first metal layer and the second metal layer are melted and bonded together and the melted first metal layer flows into the first recess.

2. The method according to claim 1, wherein, in the bonding step, the first metal layer and the second metal layer are heated while pressing one of the structure body and the substrate toward the other of the structure body and the substrate.

3. The method according to claim 1, wherein, in the first forming step, a third metal layer is disposed along an inner surface of the first recess in at least a portion of the first recess to form the first rough-surface portion.

4. The method according to claim 3, wherein, in the first forming step, the third metal layer is formed using a plating technique.

5. The method according to claim 1, wherein:
   the first forming step comprises:
      forming a third metal layer along the first surface of the structure body; and
      forming the first rough-surface portion by roughening at least a portion of surfaces of the third metal layer in the first recess.

6. The method according to claim 3, wherein a thickness of the third metal layer is less than a depth of the first recess.

7. The method according to claim 3, further comprising:
   between the first providing step and the first forming step, a third forming step comprising forming a fourth metal layer at a first surface side of the structure body, wherein:
   the fourth metal layer contains nickel,
   the first metal layer contains tin, and
   the third metal layer contains nickel.

8. The method according to claim 1, wherein:
   the first surfaces of the structure body include surfaces defining a second recess and surfaces defining a plurality of the first recesses, the second recess surrounding the plurality of first recesses and having a depth smaller than a depth of the first recesses,
   the first forming step further includes forming a second rough-surface portion at or inward of at least a portion of the surfaces defining the second recess, the second rough-surface portion being rougher than the other portion of the first surface, and
   in the bonding step, the first rough-surface portions cause the melted first metal layer to flow into the plurality of first recesses where the first rough-surface portions are formed and the second rough-surface portion causes the melted first metal layer to be flowed into the second recess where the second rough-surface portion is formed.

9. The method according to claim 1, wherein:
   the semiconductor stacked body comprises an n-type semiconductor layer, a p-type semiconductor layer, and a light-emitting layer disposed between the n-type semiconductor layer and the p-type semiconductor layer,
   a portion of the n-type semiconductor layer is exposed at a bottom surface of the first recess of the structure body, and
   the first rough-surface portion formed in the first forming step is positioned at the exposed portion of the n-type semiconductor layer.

* * * * *